United States Patent [19]

Rothschild et al.

[11] Patent Number: 5,143,894
[45] Date of Patent: Sep. 1, 1992

[54] FORMATION AND HIGH RESOLUTION PATTERNING OF SUPERCONDUCTORS

[76] Inventors: Mordechai Rothschild, 100 Clearwater Rd., Newton, Mass. 02162; Daniel J. Ehrlich, 11 Grant Pl., Lexington, Mass. 02173; Jerry G. Black, 108 Trapelo Rd., Lincoln, Mass. 01773

[21] Appl. No.: 395,145

[22] Filed: Aug. 16, 1989

Related U.S. Application Data

[63] Continuation of Ser. No. 108,426, Oct. 14, 1987, abandoned.

[51] Int. Cl.$^5$ .......................... B05D 3/06; B05D 5/12
[52] U.S. Cl. .......................... 505/1; 505/730; 505/732; 505/742; 505/701; 427/53.1; 427/62; 427/63; 428/702; 428/930
[58] Field of Search .......................... 427/53.1, 54.1, 62, 427/63; 505/1, 730, 732, 742, 701; 428/702, 930

[56] References Cited

U.S. PATENT DOCUMENTS

| | | | |
|---|---|---|---|
| 4,316,785 | 2/1982 | Suzuki et al. | 427/63 |
| 4,332,833 | 6/1982 | Aspnes et al. | 427/8 |
| 4,499,441 | 2/1985 | Lynch et al. | 333/161 |

FOREIGN PATENT DOCUMENTS

| | | |
|---|---|---|
| 0282360 | 9/1988 | European Pat. Off. . |
| 0286106 | 10/1988 | European Pat. Off. . |
| 0020486 | 2/1982 | Japan ..................... 357/5 |

OTHER PUBLICATIONS

Bednorz et al., Z. Phys. B.-Condensed Matter 64, 189–193, 1986.
Suzuki et al., *Jap. J. of Appl. Phys. Lett.*, vol. 19, No. 5, May 1980, pp. L231–L234.
Uchida et al., *Phase Transitions*, 1986, pp. 187–220.
Adachi et al., *Jap. J. of Appl. Phys.*, vol. 26, No. 5, May, 1988, pp. L709–L710.
Moriwaki et al., Derwent abstract vol. 10, No. 373 (Jap. 61-168530).
"Thin Films and Squids Made From $YBa_2Cu_3O_y$," R. H. Koch et al.; from Proceeding of Symposium S, 1987, Spring Meeting of the Materials Research Society, p. 81.
Koch et al., "Quantum Interference Devices . . . " vol. 51 *Applied Physics Letters*, pp. 200–203 (1987).
Blair et al., "Fabrication and Properties of Niobium on Sapphire . . . " vol. 50 Rev. Sci. Instrum. pp. 279–285 (Mar. 1979).
Clark et al., "Effects of Radiation Damage . . . " vol. 51 *Applied Physics Letters*, pp. 139–141 (1987).
Yan et al., "Water Interaction with the Superconducting $YBa_2Cu_3O_7$ Phase" vol. 51 *Applied Physics Letters*, pp. 532–534 (Aug., 1987).
Jin et al., "High $T_c$ Superconductors—Composite Wire Fabrication" vol. 51 *Applied Physics Letters*, pp. 203–204 (1987).
Gallagher et al., "Oxygen Stoichiometry in $Ba_2Y Cu_3O_x$" vol. 22, *Mat. Res. Bull.*, pp. 995–1006 (1987).
Khurana, "superconductivity Seen Above the Boiling Point of Nitrogen", Physics Today, pp. 17–23 (1987).
Beyers et al., "Annealing Treatment Effects . . . ", vol. 51 *Applied Physics Letters*, pp. 614–616 (Aug., 1987).
Inam et al., vol. 51 *Applied Physics Letters*, pp. 1112–1114 (1987) "Pulsed Laser Etching of High $T_c$ Superconducting Films".
Muller et al., "The Discovery of a New Class of Superconductors" vol. 237 *Science*, pp. 1133–1139 (1987).
Robinson, "Neutrons Clarify Superconductors", vol. 237 *Science*, pp. 1115–1117 (1987).
Ehrlich and Tsao, Eds., *Laser Microfabrication: Thin Film Processes and Lithography*, pp. 252–283 (1989).

*Primary Examiner*—Shrive Beck
*Assistant Examiner*—Roy V. King

[57] ABSTRACT

A method is disclosed for forming a patterned oxide superconducting film wherein a selected region of a ternary metal oxide superconducting film is irradiated in a controlled atmosphere with photons so as to become non-superconductive.

12 Claims, 8 Drawing Sheets

UNPROCESSED TARGET

MASK POSITIONING

IRRADIATION

MASK REMOVAL

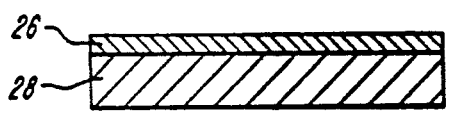
FIG. 7A UNPROCESSED TARGET
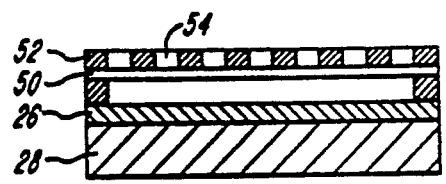
FIG. 7B MASK POSITIONING
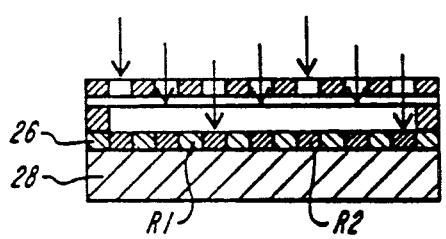
FIG. 7C IRRADIATION
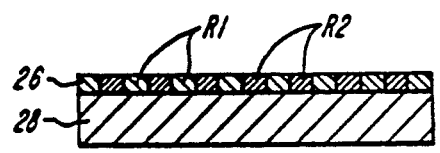
FIG. 7D MASK REMOVAL
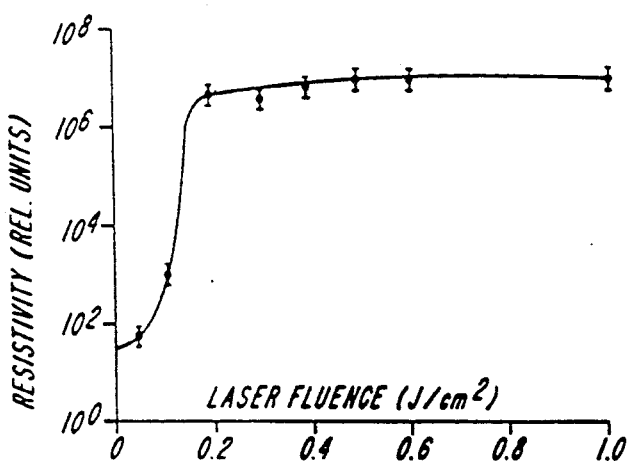
FIG. 8
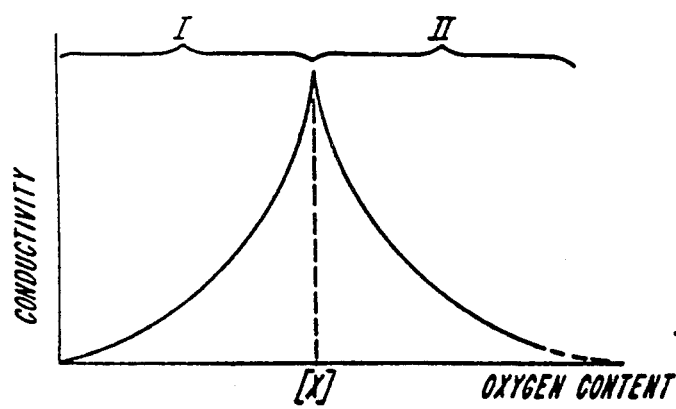
FIG. 9

|← 100μm →|

|← 50μm →|

FORMATION AND HIGH RESOLUTION PATTERNING OF SUPERCONDUCTORS

The U.S. Government has rights in this invention pursuant to Air Force Contract No. F19628-85-C-0002.

This application is a continuation of application Ser. No. 108,426, filed Oct. 14, 1987, now abandoned.

BACKGROUND OF THE INVENTION

This invention relates to superconductive materials and, in particular, to the forming of superconductive ternary metal oxide materials and patterns from such materials.

The recent discovery that certain ternary metal oxide ("TMO") materials exhibit superconductivity at temperatures much higher than previously thought possible has aroused great interest, mainly because of its potential technological applications. Work to date has generally concentrated on the identification and growth of selected materials which possess the appropriate phase and stoichiometry, and on characterization of their transport properties, crystallography, and physical and chemical stability. More recently, the deposition of thin films of these materials has been reported.

Generally speaking, superconductivity is a low temperature phenomenon in which the affected material undergoes a transition to a state in which it exhibits the remarkable properties of negligible resistance to a flow of electrons, unusual magnetic effects, such as a large diamagnetism, altered thermal properties, including changes in its thermodynamic equilibrium and thermal transport properties, etc. The temperature corresponding to the midpoint of the temperature range over which the transition to superconductivity occurs is called the critical temperature, $T_c$.

The observed critical temperatures of superconductors has slowly increased since the discovery of the superconductivity phenomenon three-quarters of a century ago, from just over 4° K. back then to approximately 23° K. in 1986 as new materials and techniques were explored. Many of these superconducting materials, if not most, were cubic niobium compounds. Since 1986 a new class of TMO superconductors, based upon copper oxides, has raised the $T_c$ limit to over 90° K.

The ensuing international focus on this new class of superconducting materials is due to many reasons. First, these metal oxides are easier to fabricate than the highly refractory niobates. Second, their transition temperatures are sufficiently high to permit the use of more practical cryogenic media, such as liquid nitrogen and more cost-effective cryogenic systems. Third, these materials raise the prospect for superconductivity at room temperatures, i.e., at approximately 294° K. And fourth, the benefits of a superconductive device employing the new materials may very well soon exceed the fabrication and operating costs which have hamstrung the commercial introduction of many superconducting devices.

Superconducting devices are expected to perform a wide range of functions, capitalizing on their unique characteristics. Such devices may be conveniently divided into two categories, small-scale electronic devices used in electronic instrumentation and computers, and large-scale devices typically having superconducting windings and used in high-energy physics research, nuclear magnetic resonance imaging (MRI), and power generation.

Commercial exploitation of TMO superconductors presently is hindered by the state-of-the-art in fabricating the materials themselves and patterning conductors made from the material.

The TMO superconducting materials are presently fabricated by mixing appropriate cations and subsequently heating the mixture for several (e.g. five) hours in an oven. Afterwards, the sample is ground and pressed into pellets, then sintered in an oven at 900° C. to 1100° C. X-ray diffraction has revealed that samples prepared in this way consist of several phases, and the relative proportion of these phases in a sample determines the superconductivity and depends on the heat treatment. Additional annealing is sometimes necessary to improve the superconducting properties.

The details of the preparation of the material determine not only the temperature of the transition to superconductivity, but also whether such a transition will occur for a given material. For example, the temperature extremes and duration, as well as the heating and cooling rates during sintering and annealing influence the oxygen concentration of the sample, which appears to be a key determinant in achieving high-$T_c$ superconductivity.

The superconductivity level of a sample can be determined by comparing the sample's magnetic susceptibility with that of an ideal superconductor. Alternatively, DC measurements of resistivity as a function of temperature can be used to gauge superconductivity. As the TMO films are presently fabricated, however, these tests are generally conducted and the quality of the sample as a superconductor determined after it is completely formed.

When fabricated in thin films for small-scale devices, the traditional superconducting materials, e.g., niobium compounds, have generally been patterned into superconducting circuits using conventional patterning techniques. Commonly used patterning techniques, however, are not appropriate for all materials. It appears that they may not be appropriate for the new TMO's. For example, many copper oxide-based TMO's are extremely sensitive to moisture. In the presence of water or water vapor, the trivalent copper ions are reduced to the bivalent state, accompanied by the irreversible decomposition of the material. Therefore, patterning y conventional lithographic methods which generally include exposure to water-containing chemicals appears to have series drawbacks for this material.

Accordingly, an object of the invention is to provide improved methods and systems for fabricating and patterning thin film superconductors.

A further object of the invention is to provide an improved superconductive device.

Yet a further object of the invention is to provide methods and systems for real-time, on-line monitoring of superconductive thin films during fabrication and patterning.

SUMMARY OF THE INVENTION

Ternary metal oxides and similar copper oxide-based materials which are capable of superconduction can be fashioned into superconductors and patterned to form electronic devices and the like by photo-induced transformation and, optionally, photoablation. The transformations preferably are achieved by laser irradiation in a controlled ambient environment.

The invention can be employed in the bulk fabrication of superconducting films, layers, wires, windings, sheets and ingots by transforming extended areas, wide regions, surfaces or entire volumes of TMO materials into superconductors. The photo-induced transformation operates to modify the oxygen content and structure of the material until an optimal state of superconductivity is achieved. The photo-induced transformation can be achieved with various laser sources and, in some instances, by non-coherent illumination.

The invention can also be employed in the patterning of such superconducting materials. Patterning, as the term is used herein, is intended to encompass surface transformations, as well as volumetric transformations of selected regions of a TMO material.

Patterns of superconductive regions in an otherwise non-transformed TMO material and, conversely, patterns of substantially non-conductive regions in a superconductive material layer can be achieved by selective photo-transformation. This patterning can be achieved with lasers in either a direct write, contact mask or mask projection modes of operation, or with incoherent light sources (particularly in the contact mask mode). The ambient atmosphere during irradiation is either oxygen-rich or oxygen-deficient depending on the material's initial state.

Patterns can also be achieved in superconducting materials by laser-induced photoablation. In the laser ablation patterning process, regions of a superconducting film are subjected to laser radiation at a sufficient power or fluence to remove the film from these regions. The remaining film defines the patterns.

In situ, real-time, process monitoring of the material transformation is effected by measuring the optical constants of the material. The degree of reflectivity, transmissivity or opactiy is indicative of the conductive state of the material.

The invention also embraces systems used in carrying out the above-described methods, as well as resulting superconducting devices, such as, for example, superconducting quantum interference devices. The superconducting devices of the present invention are formed by photo-induced transformation and photoablation techniques to yield appropriate patterns of superconducting regions which thereby define electronic circuits.

BRIEF DESCRIPTION OF THE DRAWINGS

Other objects, features, and advantages of the invention will become apparent from the following description taken together with the drawings, in which:

FIGS. 7A, 7B, 7C and 7D are sectional side views illustrating the fabrication of a superconducting device by material transformation in accordance with the invention;

FIG. 8 is a graph of resistivity vs. laser fluence derived with the apparatus of FIG. 1;

FIG. 9 is a graph of conductivity vs. oxygen content;

DETAILED DESCRIPTION

Figure 1:
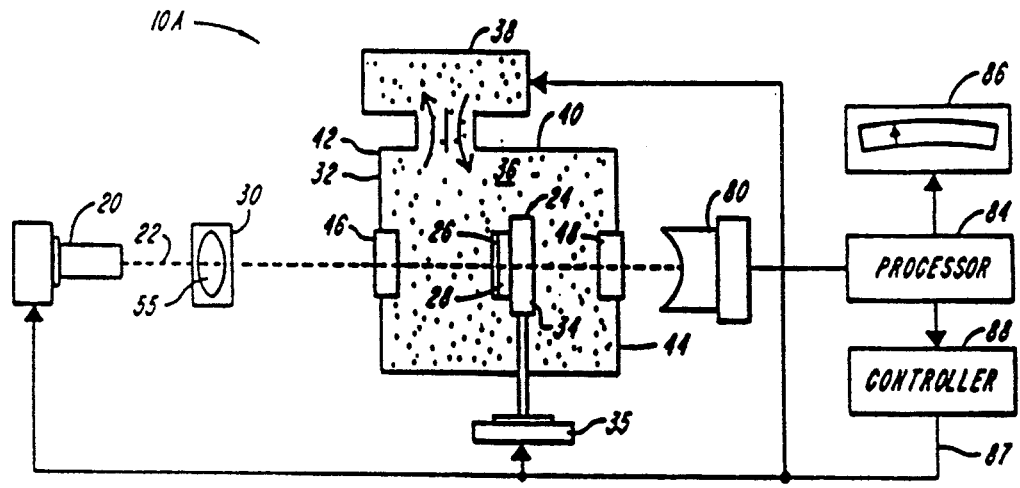
FIG. 1 is a schematic representation of a laser-based direct writing apparatus according to a first embodiment of the invention.

The new class of high-$T_c$, TMO superconductors embrace a wide variety of materials typically described by the formula

$$MBa_2Cu_3O_x$$

where "M" is a transition metal or rare earth ion, for example, consisting of Yttrium, Scandium, Lanthanum, Neodymium, Samarium, Europium, Gadolinium, Dysprosium, Holmium, Erbium, Ytterbium, and Lutetium; and "x" is a number between approximately six and nine. In some instances, the barium component of the TMO material can also be replaced by strontium or another transition metal. For simplicity and by way of illustration, without intending to limit the invention, the description which follows shall be directed to an oxide of Y-Ba-Cu. The invention can be practiced, however, with a thin film of any suitable TMO material.

In one aspect of the invention, extended film areas (e.g., sheets) or bulk volumes, (e.g. ingots) of TMO materials can be rendered superconducting by photo-induced transformations.

In another aspect of the invention, patterns of superconducting and substantially non-conducting paths can be integrally formed in TMO materials, especially thin TMO films (e.g., less than one micron thick) disposed over a substrate. Generally speaking, the patterns are fashioned by a laser through a process of laser ablation, or by a laser or other photokinetic source through a process of material transformation. In laser ablation, superconductive paths are defined in a superconductive film through the removal of adjacent material bounding the paths. In the material transformation process, either (i) the path's boundary material in a superconductive film is transformed to have non-superconducting or even dielectric properties, or (ii) the path, itself, in a non-superconductive state of the film is transformed so as to exhibit superconductivity.

In yet another aspect of the invention, both photo-induced and conventional (e.g., oven heating) techniques can be monitored by measuring changes in the optical constants of the TMO material to achieve a superconducting state and optimizing it.

Throughout the description of the invention, the term "superconducting" shall be used in its broader sense to describe a material which can exhibit the properties of a superconductor when sufficiently cooled. Thus, a material shall be referred to as a superconductor even though, for example, the temperature of the material is above its critical temperature of transition to the superconducting state. By the same token, a non-superconducting material is one which is not capable of superconduction, as that term is generally understood, at least at temperatures above approximately 4° K.

The laser us-ed in he practice of the invention can either be a continuous wave ("CW") or a pulsed (e.g., excimer) laser, taking advantage of either direct writing, contact masking or optical projection modes of patterning. While each has its advantages, CW lasers have been found to offer a particular advantage for extended-area material transformations in accordance with the invention. On the other hand, excimer lasers typically are more useful in patterning applications, especially photoablation, because of the limited substrate heating exhibited by the pulses. However, process monitoring in accordance with the invention can be practiced with either type of laser or even with a non-laser photothermic irradiation source.

For real-time monitoring of the TMO transformation process, in situ during the material transformation between superconducting and non-superconducting states, the optical constants of the TMO material can be monitored. As the TMO material is transformed, its reflectivity and absorptivity correspondingly change. The TMO material exhibits an optical transmission of approximately 1% at 1 μm (micron) thickness ($Y_1Ba_2Cu_3O_x$) while superconductive, and a substantially greater optical transmissibility (e.g., 15% to 50%) when not superconductive.

Thus, the measured opacity (or, alternatively, reflectivity) correlates with the conduction state of the material. Changes in the optical constants of the material can be measured directly to indicate completion of the transformation, or area-averaged measurements can be compared with predetermined or computer-generated specifications to monitor, control and display the progress of the transformation.

The light source for the measurement of the optical constants can in some instances be the same laser that is employed for transformation and/or ablation. In the preferred embodiments, however, a separate laser (or other sufficiently narrow bandwidth light source) is employed to monitor the material.

To convey an enabling understanding of the invention, several suitable embodiments of apparatuses utilized in the practice of the invention shall be described along with further details of the TMO film and the results and consequences of Processing. These are provided for illustrative purposes only, without intending to be limited thereby. One skilled in art will be able to discern various changes, extensions, modifications and substitutions to the described embodiments. It is intended that the claims be construed to claim and protect the invention according to their respective scope and range of equivalency, without being unduly limited by the illustrated drawings and corresponding description given herein.

With reference now to the drawings, FIGS. 1 through 4 show alternative embodiments of a laser-based apparatus 10A, 10B, 10C and 10D for bulk processing or patterning a TMO film in accordance with a practice of the invention. As shall be more fully explained below, the apparatuses 10A, 10B, 10C and 10D can be used in extended area transformation of non-superconducting TMO films, as well as high resolution patterning of a previously deposited superconductive film, or in the micro-formation of superconductive patterns from and integrally within a non-superconducting TMO film.

More specifically, the illustrated apparatus 10A, 10B, 10C and 10D takes advantage of an irradiation source 20, preferably a CW or excimer laser. The laser 20 is operable to produce a beam 22 of energy at a selected frequency and a selected power level. The laser 20 directs the beam 22 toward a target body 24. The target body 24 includes a TMO film 26 deposited on a substrate 28.

The beam path extends from the laser 20 through optics 30 (e.g., a focussing or diffusing lens system) into a gas-tight chamber or cell 32 which has the target body 24 supported therein by a support stage or jig 34. Preferably, the stage 34 holds the periphery of the substrate 28 in a frame-like manner and is capable of movement in the X and Y directions (orthogonal to the beam) as well as in the Z direction (along the beam axis) under the control of translation driver 35.

The chamber 32 contains a gaseous mixture 36, supplied by a gas supply assembly 38. For example, the gaseous mixture can be oxygen-rich gas, air, or an oxygen-deficient or non-oxygen gas, such as nitrogen. Alternatively, the chamber can be pumped to vacuum. Chamber 32 is shown for illustration purposes as a closed cylindrical member which can be formed, for example, from stainless steel or the like. The chamber 32 has a cylindrical wall 40 which is closed at its first and second ends by a front wall 42 and a rear wall 44, respectively. The illustrated front wall 42 has a window portion 46 which is transparent to the laser beam at the frequency selected. A transparent rear window 48 can also be fitted to chamber 32.

In FIG. 1, an apparatus suited for extended area transformations as well as direct writing applications is shown. Depending upon the application, the laser can be a CW or pulsed laser. In extended area transformations, optics 30 includes a diffusing or defocussing lens package which illuminates an extended area of the TMO material. In direct writing applications, the optical system 30 includes a focusing lens package 55, preferably in the form of microscope lenses which focus the laser beam 22 onto the film 26. The beam 22 is scanned relative to the target body 24 (by movement of the stage or the laser itself) to achieve a direct pattern of exposure. The direct writing can be accomplished by photoablation or material transformation as discussed further below.

Figure 2:
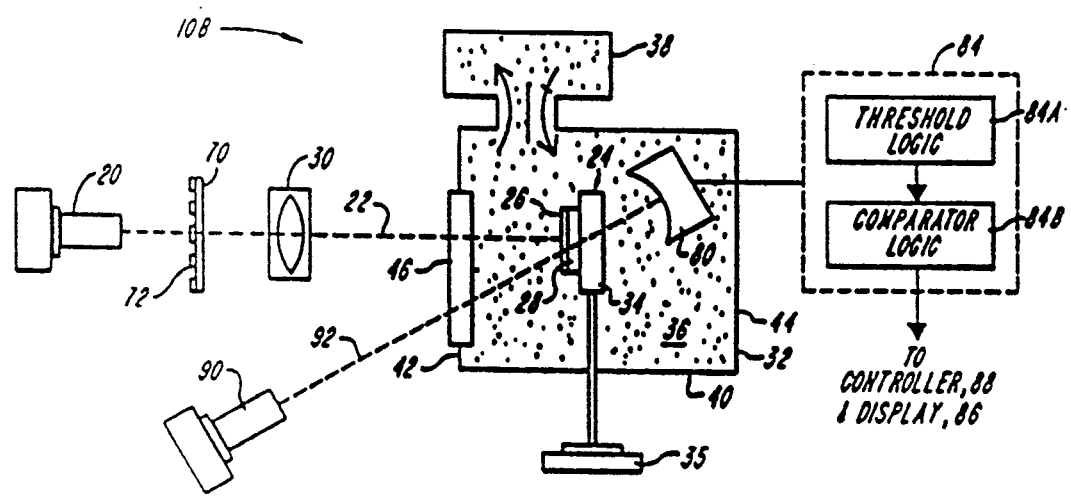
FIGS. 2 and 3 are schematic representations of alternative laser-based mask projection apparatuses according to a second embodiment of the invention.

In FIG. 2, a mask projection mode of operation of the laser 20 is illustrated. The laser 20 is preferably a pulsed laser, such as an ArF excimer laser. A transmission reticle 70 having a mask 72 is interposed in the light path between the laser 20 and the optical system 30 which includes an imaging lens. The pulse beam 22 is directed through the reticle 70, the imaging lens 30 and the transparent window 46 in the chamber 32 so as to strike the film 26. The laser ablation and material transformation. processes proceed substantially as described above with reference to the direct write mode, except, of course, without the contact mask deposition or removal steps.

Figure 3:
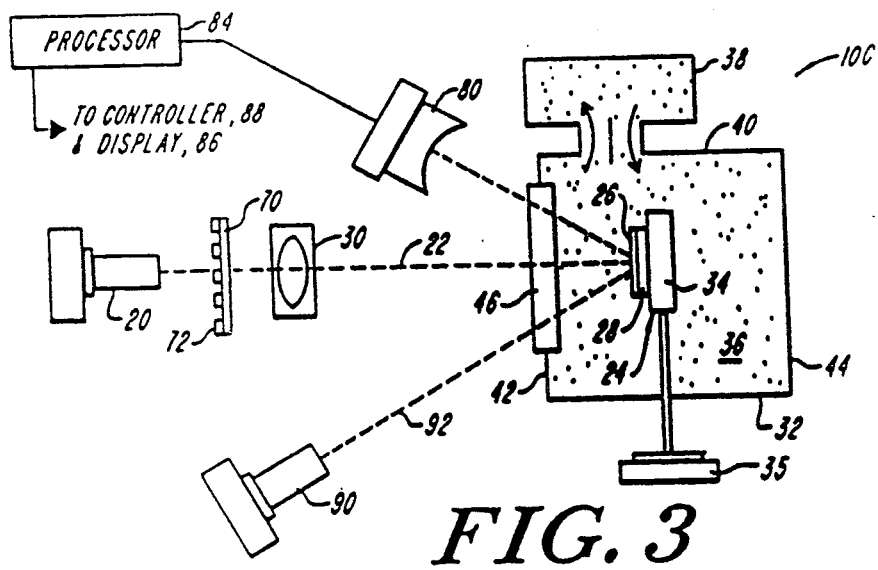

In FIG. 3, a similar mask projection system is shown having a reflective feedback control mechanism (discussed below).

Figure 4:
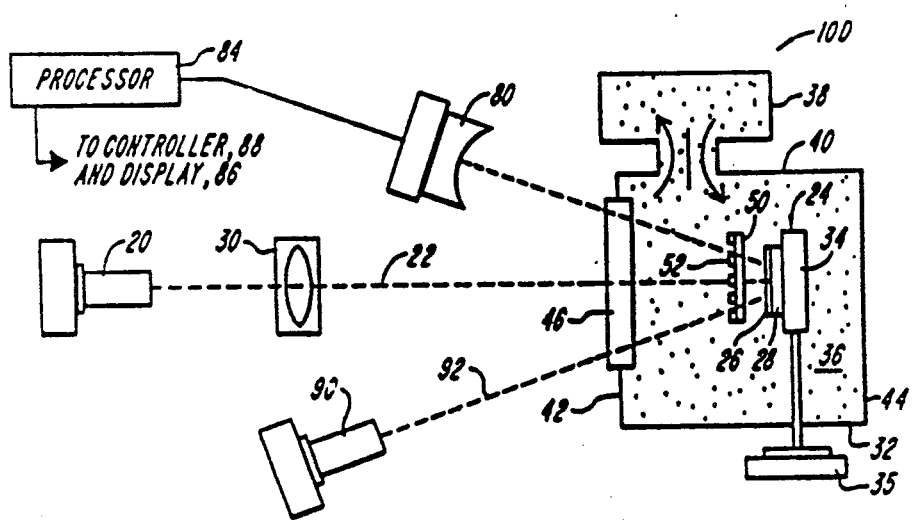
FIG. 4 is a schematic representation of an alternative laser-based contact mask apparatus according to a further embodiment of the invention.

In FIG. 4, a contact mask system is shown. The laser 20 again is preferably a pulsed excimer laser. (In some instances, an appropriate incoherent light source can be substituted for laser 20.) Optical system 30 includes appropriate lens to shape the beam for wide area exposure. A masking (e.g., glass) plate 50 carrying an optical contact mask 52 is disposed directly above the surface of the target body 24, and the beam from light source 20 is directed through the mask onto the TMO material to effect a pattern therein.

Figure 5:
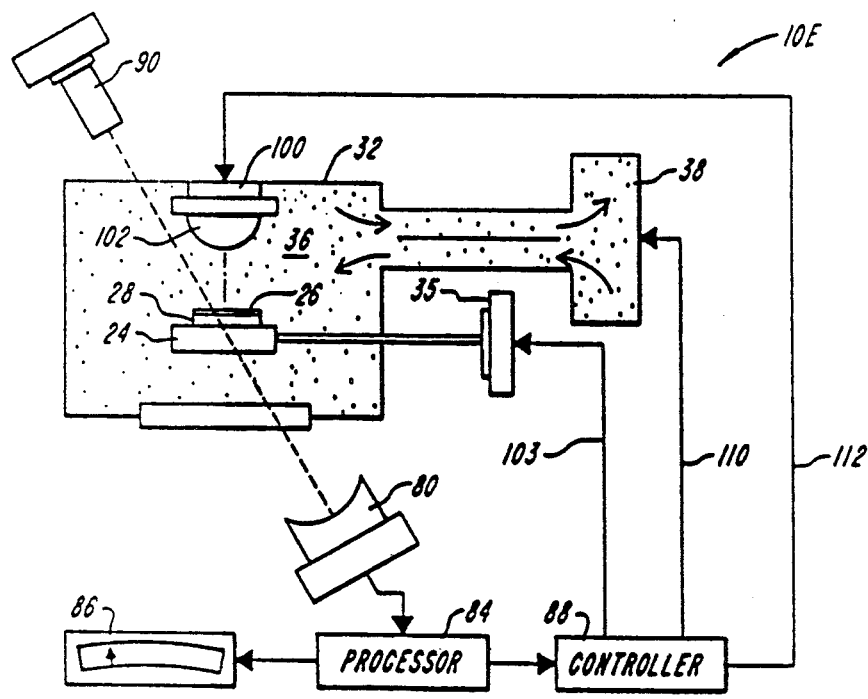
FIG. 5 is a schematic representative of an alternative apparatus employing an incoherent source according to yet another embodiment of the invention.

In FIG. 5, instead of a laser, the apparatus 10E incorporates a rapid thermal annealer 100 (commercially available, for example, from AG Associates, Sunnyvale CA) comprising a quartz lamp heating unit 102 disposed above the surface of a TMO film 26 for white light heating of the film. As before, the film 26 is disposed on a substrate 28 to form target body 24 within the chamber 32 having an ambient environment 36 regulated by a gas supply assembly 38.

It is desirable to be able to monitor the material transformation on the target body during irradiation within the chamber 32. In accordance with another aspect of the invention, such real-time, in situ monitoring can be achieved by taking advantage of changes in the optical constants of the TMO film as it is transformed between non-superconducting and superconducting stages. The optical constants include the reflectivity and absorptivity of the material and can be determined from the real and imaginary components of the index of refraction To this end, the apparatus 10A, 10B, 10C, 10D and 10E further include a photo-detector 80 mounted to intercept and measure the intensity or other parameter of a beam after it strikes the film 26. When a selected opacity or otherwise a selected optical absorption or transmissivity level has been reached, as detected by the photo-detector 80, the material transformation is complete. The photo-detector 80 can be, for example, a photodiode or other opto-electrical transducer.

The photo-detector can be incorporated into a film patterning apparatus in a variety of different configurations and arrangements. For example, the detected beam can be beam 22, or another beam for example, from as second light source. Also, the photo-detector can be operated in a light-transmissive or light-reflective arrangement.

Returning to FIG. 1, the illustrated photo-detecting element 80 is shown in a light transmissive detection arrangement, being disposed in the laser light path behind the target body 24. The incident beam 22 passes through front window 46 of the chamber 32, through the target body 24, through the stage 34, through rear window 48 and is monitored by the photo-detecting element 80. For this transmissive arrangement, the substrate 28 is selected to be substantially transparent to the laser beam and, for example, is made of zirconia, quartz, or sapphire. The stage 34 has an opening or window to permit the transmission of the beam therethrough. The photo-detecting element 80 is stationary and disposed to intercept the beam (as attenuated by the TMO film 26, and to some nominal degree by the gas mixture 36 and substrate 28). In this case an economy of hardware is achieved since the laser 20 used for material transformation is also used to gauge the opacity of the TMO film 26.

The output from the photo-detecting element 80 is amplified and/or further processed by a signal processor 84 which directs the processed signal to a visual display apparatus 86, for example, a digital or analog meter, chart recorder, oscilloscope or video display.

As the material transformation of the TMO film 26 ensues and the intensity of the beam intercepted by the photo-detector correspondingly changes with the opacity changes in the transformed film, the photo-detecting element 80 provides an immediate indication of the physical process and the state of superconduction of the film 26.

The material transformation can even be automated using the processed signal from the processor 84 as a feedback signal which controller 88 manipulates into a control signal delivered over bus 87 to control a parameter of the laser beam, for example, its power or duration, and/or the operation of the translator 35. The control signal can alternatively or additionally be used to regulate the oxygen (or other gas) content of the gaseous mixture supplied by the gas supply 38.

In FIG. 2, a variation of a light-transmissive arrangement of the photo-detector is featured. Here, a second light source 90, preferably a laser operating at a low power, for example, of between approximately one and five milliwatts directs a beam 92 along a light path angularly offset from that of beam 22, though focused on the same spot as beam 22. The photo-detecting element 80 is mounted within the chamber 32 in a suitable position and orientation to intercept beam 92. As illustrated, the photo-detecting element 80 is attached to the cylindrical the rear wall 44.

Unlike the light transmissive arrangements of FIGS. 1 and 2, the photo-detecting element 80 is shown in FIGS. 3 and 4 in a light reflective arrangement. Such an arrangement finds particular utility in connection with processing a target body 24 having a substrate 28 which is not transparent to the laser beam 22 at its selected frequencies, such as one made of silicon, or silicon coated with a dielectric, such as silicon dioxide or aluminum oxide. In this reflective arrangement, a second light source 90, preferably a low power laser, directs a beam 92 to the TMO film 26, which is reflected therefrom along path 96. The illustrated photo-detective element 80 is mounted outside the chamber 32 in a suitable position and orientation along light path 96 so as to intercept beam 92 after it is reflected from the film 26. It can be readily appreciated that, with light source 90 directing the beam 92 at an angle R with respect to the illustrated beam 22 (which is generally normal to the film 26), the reflected light path 96 is at an angle minus R. Preferably, R is an acute angle.

In FIG. 5, another light transmissive monitoring system is shown in connection with rapid thermal annealer 100. In the apparatus 10E, light source 90 and photodetector array 80 are used to monitor the transformation process and can be connected to a controller 88 which regulates flash exposure, temperature cycling, total dose, translation rate of the stage, ambient atmosphere content and/or other parameters. To that end, the illustrated controller has an output 108 connected to the stage translator 35, and output 110 connected to the gas supply 38 and an output 112 connected to the quartz lamp heating unit 102.

In superconducting film-fabrication and direct write modes of operation, the detected opacity can be directly used to indicate completion of the transformation and/or patterning. In an optical projection mode, the area-averaged detected opacity, or otherwise the absorption or transmisstivity level for the entire exposed film, can be compared with a computer-generated area-averaged target threshold of opacity to indicate the completion of the transformation. For example, in FIG. 2 the processor 84 can have threshold logic 84A for setting or generating the target opacity threshold and can have comparator logic 84B to determine if the detected opacity equals the threshold. In this manner, even with, for example, 20% to 25% of the TMO film undergoing transformation at the same time, the status of the transformation and the state of conductivity of the material can be monitored.

Optimal superconductivity in TMO materials is achieved by controlling the oxygen content and polycrystalline structure. Typically, the TMO material is oxygen deficient upon initial deposition. By irradiation in a controlled oxygen-rich environment, the material is transformed to its superconductive state. The transformation can be monitored, as discussed in more detail below, by measuring changes in the material's optical transmission or reflectance characteristics. Once the bulk transformation is achieved, the material can be patterned by further selective transformation back to a substantially, non-superconductive state or by laser ablation.

Figure 6A:
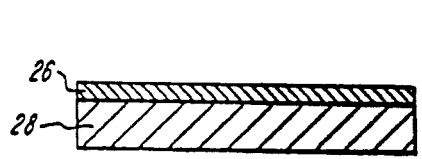
FIGS. 6A 6B, 6C and 6D are sectional, side views illustrating the fabrication of a superconducting device by photoablation in accordance with the invention.
Figure 6B:
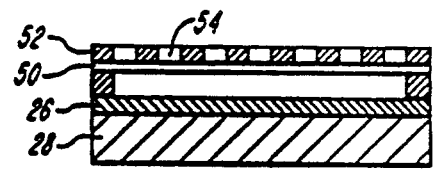
Figure 6C:
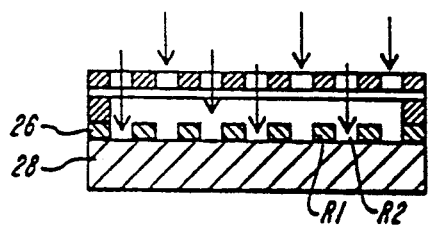
Figure 6D:

Four steps of the laser ablation method in the contact printing mode are illustrated in FIGS. 6A through 6D. In FIG. 6A, the target body 24 is shown as including the substrate 28 on which is disposed the TMO film 26. (Although the film 26 and substrate 28 are illustrated as coplanar layers, it should be clear that they just as readily can be non-planar, and the TMO film can overlie a profiled substrate comprising various layers and thicknesses.) In FIG. 6B, a masking plate 50 carrying mask 52 is positioned by known methods within an appropriately close distance of surface of the ternary metal oxide film 26. The mask 52 is positioned, also by known processes, so as to shadow selected regions R1 of the film 26 and have at least one opening 54 with a plurality being shown by way of example, so as to continue to expose selected other regions R2 of the film 26. In FIG. 6C, the masked target body is irradiated, with the incident beam 22 striking and selectively ablating the exposed portions of the film 26 through each opening 62 in the mask 60. In FIG. 6D, the mask 60 is removed, leaving at least one conductor C, with four being shown by way of example, patterned out of the film 26. The conductors C are defined and bounded by the ablated regions of the film 26 and comprise the regions R1.

FIGS. 7A through 7D illustrate four steps of the material transformation process utilizing the contact printing mode of the laser. In FIG. 7A, the illustrated target body 24 is identical with that shown in FIG. 5A. The target body 24 has a TMO film 26 deposited on a substrate 28. Mask positioning depicted in FIG. 7B also proceeds identically with that shown in FIG. 6B. A masking plate 50 carrying mask 52 with openings 54 is positioned over the film 26. The mask 52 shadows a plurality of first regions R1 of the film 26 so as to shield the first regions R1 and permit radiation to expose a plurality of second regions R2. In FIG. 7C, however, an important difference is illustrated. The mask openings 54 permit the irradiation of a plurality of second regions R2 of the film 26, which undergo material changes resulting from the irradiation. As is shown in FIG. 7D, upon removal of the mask 52 from the target body 24, the film includes unaffected first regions R1 and transformed second regions R2.

As introduced above, the material transformation can proceed along either of two very different tracks depending on the material and techniques used. Where the film 26 is made of a superconducting TMO material, region R1 defines a superconducting path, and the second region R2 is transformed from a superconducting state to a non-superconducting state or even into a dielectric. Where the film is initially non-superconducting and made of a selected ternary metal oxide compound which is nearly chemically complete (i.e., is chemically complete except in respect of its oxygen content and crystallography, as shall be described more fully below), the first regions R1 are non-superconducting, while the second regions R2 are transformed from non-superconducting to superconducting states. Thus, in the latter approach, the second regions R2 are transformed into the conductive paths.

In a first illustrative application of the laser ablation method using the mask projection mode, patterns were formed in a 0.8 micron thick Y-Ba-Cu-O film with a normal composition of Y $Ba_2Cu_3O_x$ (where x is between approximately six and nine). The film was electron-beam-evaporated on a stabilizer zirconia substrate and annealed in an oxygen atmosphere. The film exhibited a superconductive transition at a critical temperature of 95° K. The ablated portion was "dug" at a rate of 0.5 micron depth per laser pulse of 5 Joules/$cm^2$ of irradiated film surface area. The actual ablated portion in this application was 0.5 mm in diameter. The formed conductor had smooth, though slightly angled, side walls.

In another illustrative practice of the invention, this time utilizing the material transformation process in the mask projection mode, 0.8-$\mu$m-thick Y-Ba-Cu-0 film, with a nominal composition of $YBa_2Cu_3O_x$ (where x was between six and nine), was electron beam-evaporated on an yttrium zirconate substrate and annealed in an oxygen atmosphere. It was polycrystalline and exhibited a superconductive transition at a critical temperature of 95° K. At room temperature, this material is metallic, and its appearance is black. Irradiation with a pulsed UV laser producing 15 ns long pulses at a frequency of 193 nm with an air or an oxygen rich ambient atmosphere within the chamber locally transformed the film into an insulator. As is shown graphically in FIG. 8 in which resistivity of the irradiated region is plotted against laser fluence, the transformation is strongly non-linear. It exhibits a threshold at $-50$ mJ/$cm^2$, and saturation is achieved at 0.2 J/$cm^2$. At saturation, electrical resistivity of the exposed areas at room temperature is five orders of magnitude higher than that of the unexposed film. At all fluences plotted in FIG. 8, no ablative removal of material was noted. Detectable laser ablation started at fluences which were 10-15 times higher than the 0.2 J/$cm^2$ required to saturate the solid state superconductor-to-dielectric transformation.

It was recognized that the change in electrical conductivity during the TMO material transformation process is accompanied by a notable increase in film, transmisstivity at optical frequencies; and, therefore, it is possible to conveniently map out the transformed second regions R2 with an optical microscope after completion of the process.

The information developed through process monitoring can be used to control the material transformation. To aid in understanding this aspect of the invention, consider FIG. 9. FIG. 9 is a graph of conductivity versus oxygen content of the film material. In a first region designated "I", the oxygen content is deficient and as the oxygen content increases, the conductivity increases. The slope in this region is positive. The conductivity increases with oxygen uptake to a maximum value. Thereafter, in a second region, designated "II", the film material is over oxidized, and conductivity decreases with the addition of more oxygen. The slope in the second regime is negative.

The use of process monitoring to control transformation shall now be more fully described with continued reference to FIG. 9. In using the photo-detector in accordance with the invention, the material transformation of a non-superconducting TMO film region to render it superconducting is carried out until the conductivity peak is detected, at which time the desired superconductive state has been attained. For transformation to a non-superconducting state, the superconductive TMO film is processed in a suitable ambient atmosphere, such as an oxygen deficient or oxygen-rich atmosphere, to shift its conductivity to the right or left, respectively, of the illustrated peak. A shift in opacity or optical absorption or transmisstivity of a selected extent assures that the desired final state of conductivity has been reached.

While in FIG. 9, conductivity is plotted against oxygen content, other variables, such as temperature, play a role in the transformation process. Using a photo-detector to locate the superconductive peak provides an empirical method of process monitoring and control which does not require a full understanding of the process mechanism underlying the shifts between states of conductivity.

A further understanding of the invention can be had through the following descriptions of exemplary, non-limiting results of the material transformation processes.

Figures 10, 11:
FIGS. 10 and 11 are micro-photographs of patterned superconducting materials in accordance with the invention.

FIG. 10 demonstrates the capabilities of laser induced patterning, as well as process monitoring with a photo-detection element. In this figure, an optical transmission micro-graph of a patterned region in a $YBa_2Cu_3O_7$ superconductive film is shown. Regions of the film were transformed to a non-superconducting state. Patterning was accomplished in a projection geometry with a single pulse from a ArF excimer laser at 193 nanometers and 0.5 $J/cm^2$ fluence. The lines in this figure are seven to ten microns wide, demonstrating the high resolution achievable with this technique. Physical removal of the material (by ablation) was typically less than 5 percent of the film thickness.

FIG. 11 is a transmission optical micro-graph of a pattern generated with a focused Ar ion laser operated at 488 nm in a direct writing configuration. The focal spot was five micrometers in diameter, the scan rate was 25 micrometers/sec, and the laser power varied between 0 and 100 mW. There was no physical removal of material, only solid state transformation. The polycrystalline grain structure of the thin Y-Ba-Cu-0 film is also visible in this figure. As with the UV laser, there is a direct correlation between higher optical transmission and higher room temperature electrical resistivity.

Figure 12:
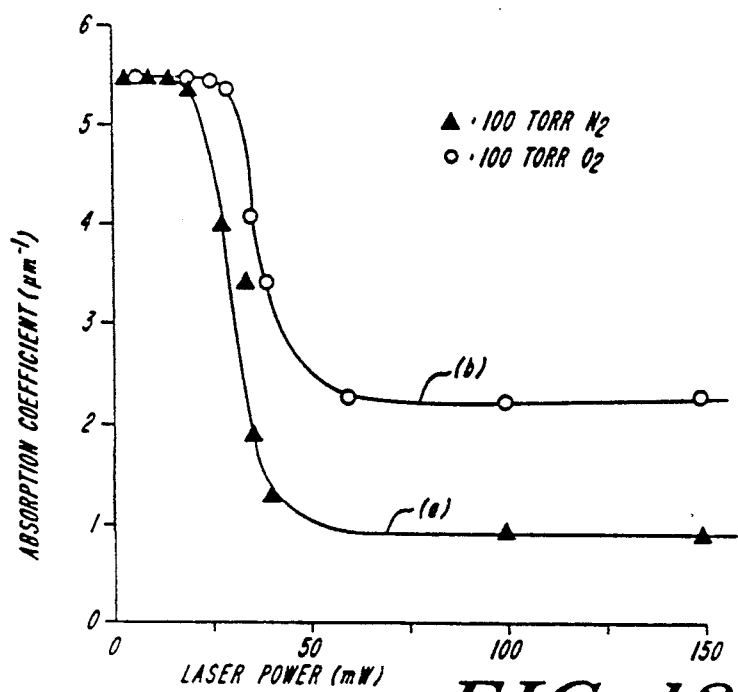
FIG. 12 is a graph of absorption coefficient as a measure of opacity vs. laser derived with the apparatus of FIG. 3.

FIG. 12 shows the power dependence of the absorption coefficient in the blue-green region, i.e., at approximately 488 nm. In this graph, the optical absorption coefficient of an initially superconducting Y-Ba-Cu-0 film is plotted against various laser power conditions. Apparent is the extent to which the film becomes transparent as a function of laser power and the gas mixture on the reaction chamber. With 100 Torr of nitrogen, curve "a" resulted, while with 100 Torr of oxygen, curve "b" was generated. Clearly, the ambient has an effect on the laser power necessary for the onset of the transition, as well as on the final stage. Both curves start at approximately 5.5/micrometer, and as power increases enter a transition regime of negative slope until at a higher power the curve once again levels off at a non-superconducting state. Nitrogen requires less laser power than oxygen to drive the film material non-superconducting, the transition for nitrogen commencing at a lower power. This dependence exhibits a threshold behavior at approximately 40 mW, and saturation is seen above approximately 70mW for both gases.

A mechanism whereby lasers induce such dramatic changes in the electrical and optical properties of TMO films appears to be based upon manipulation of the oxygen content of the film. Laser irradiation causes local heating, which may modify the crystalline structure and change the stoichiometry, as well. Neither the heavily oxygen deficient nor the heavily oxidized compounds exhibit superconductivity. Laser heating in a controlled ambient can effect this delicate balance and induce transformation from the superconductive to a dielectric phase or vice-versa.

It has been reported that a cycle of slow heating and cooling in oxygen leaves the superconductive material unchanged, presumably as a result of oxygen loss followed by oxygen uptake. In laser treatment, however, the heating and cooling stages are several orders of magnitude more rapid, and the final state is clearly different from the starting state.

When processed in accordance with the invention, two non-superconducting phases are believed to exist—one corresponding to an oxygen-rich atmosphere and the other corresponding to an oxygen-deficient (e.g., nitrogen) atmosphere during processing. Each of these phases gives rise to a different threshold and different transmissivities.

Figure 13:
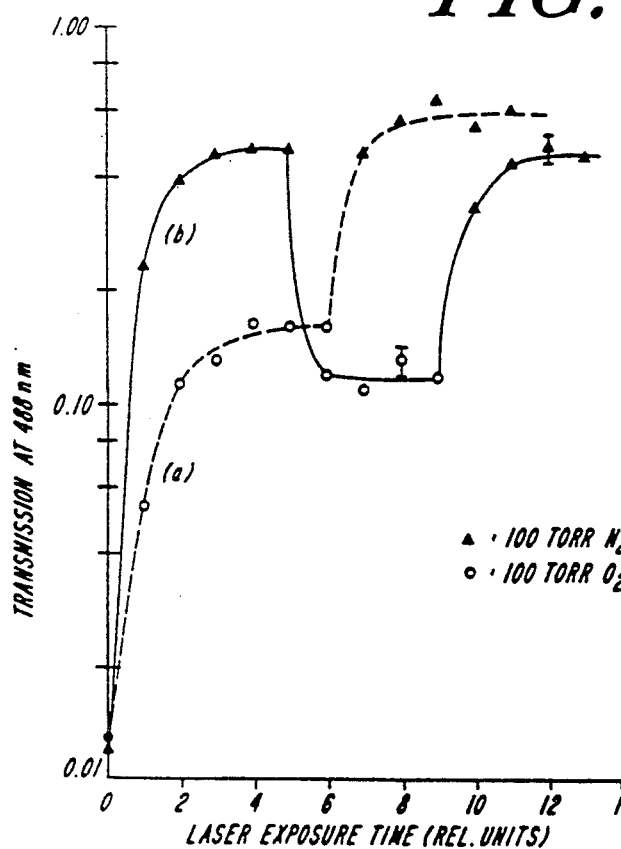
FIGS. 13, 14 and 15 are graphs, respectively, of optical transmission vs. laser exposure time, absorption coefficient vs. oxygen partial pressure, and absorption coefficient vs. laser exposure time, demonstrating the effects on opacity of the reaction ambient atmosphere.

FIG. 13 graphically demonstrates that the film can be switched back and forth between the two phases. In FIG. 13 is plotted transmission of a beam at 488 nanometers (as detected) against laser exposure time for a Y-Ba-Cu-O film. Curve "a" shows the transmission of the film resulting from repeated scanning of the same target area of the film, as the ambient gas mixture is alternated between oxygen and nitrogen, in that order. Curve "b" shows similar results, this time with the first scans being in a nitrogen ambient, followed by scans in oxygen and then again in nitrogen. In all instances, re-scanning was repeated in a single ambient until saturation was reached. The curves in this figure show that by changing ambient gas mixtures, a nearly immediate corresponding change in the optical transmission resulted. It would appear, therefore, that the transformations are reversible between the non-superconducting phases.

Figure 14:
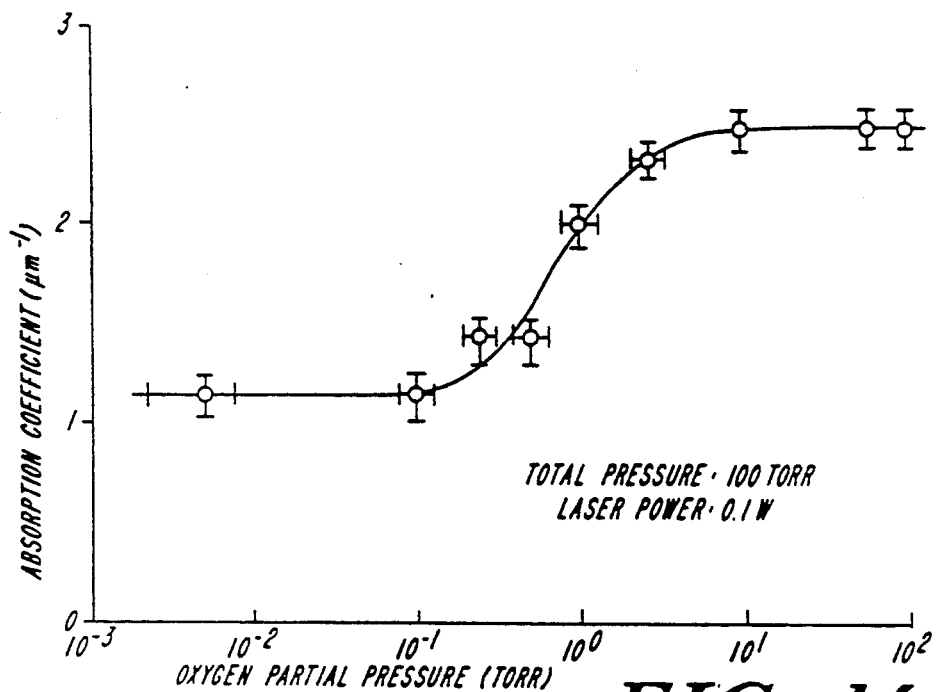

In FIG. 14, the consequences of admixing oxygen with nitrogen in various amounts within the chamber during processing of a Y-Ba-Cu-0 film are graphically shown. The absorption coefficient is plotted against oxygen partial pressure. A fixed total-pressure of 100 Torr was maintained, and a laser power of 0.1 watts was utilized. As long as the oxygen content was above approximately 1 Torr (which is equivalent to 1 millimeter of mercury), the final phase was the oxygen-dominated one. Below approximately 0.1 Torr of oxygen, the final phase was the nitrogen-dominated one.

Figure 15:
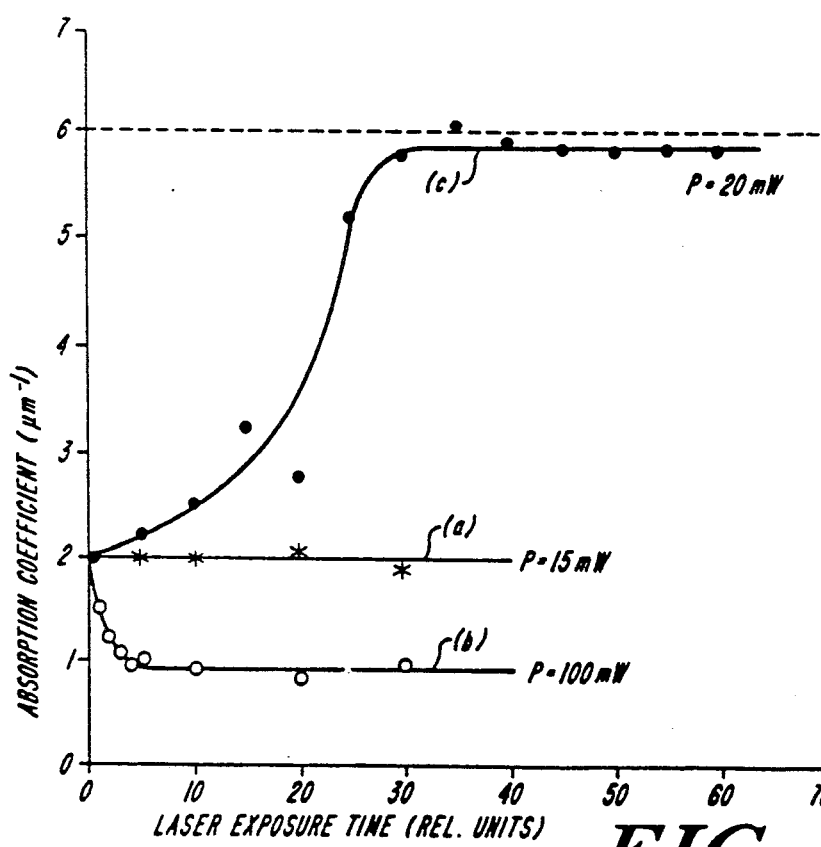

In FIG. 15, the absorption coefficient is plotted against laser exposure time to show the progression of the TMO material from transmissive to opaque, i.e., from non-superconductive to superconductive. The curves resulted from re-scanning the same area of the film in the presence of 100 Torr of nitrogen. Here, the film initially was non-superconductive, having been transformed already with a laser in an oxygen ambient at 100 mW laser power, in accordance with the invention. At a low power of 15 mW, no apparent change occurred, as shown in curve "a". At high power of 100 mW, the film becomes less absorptive, as shown by curve "b". Curve "b" is similar to the second part of curve "a" in FIG. 11. However, at the intermediate power of 20 mW, the film becomes increasingly opaque with each additional scan and ten reaches a plateau, as shown by curve "c". The plateau is very close to the value of the initial superconducting phase, shown in a broken line near the top of the graph. Thus, the film was transformed from a superconductive to a dielectric in the initial oxygen step and then back to superconductive in nitrogen at 20 mW laser power.

Hereinabove, in transforming TMO materials, the source of the radiation has been described as producing a laser beam of pre-selected power to selectively heat regions of the material. The photo-induced transformation is local, primarily because thermal conduction is limited by the substrate. The substrate is thermally insulative. For example, a sapphire substrate has a thermal conductivity of 0.1 to 2.2 watts/cm/K, and a quartz substrate has a thermal conductivity of 0.011 watts/cm −° K., both at room temperature. The heating causes the in-gassing or out-gassing of oxygen from the exposed regions of the metal oxide material. The localized temperatures needed to produce the desired effect, of course, also depend on the material and operating conditions. For example, ambient pressure influences the heating rate and the dissipation of heat. Generally, however, a few hundred degrees centigrade (e.g., 300° C. to 1000° C.) appears to be a threshold in the transformation. The above described laser processes are attractive since they are dry, resistless, rapid, capable of submicron resolution, and lend themselves to commercial production.

While use of a laser, therefore, appears preferable, the invention can be practiced using a non-laser source of irradiation to produce the TMO material transformation particularly for large sheets of TMO materials. Material transformation, for example, from a non-superconducting state of a potentially superconducting TMO film to a superconducting state can be implemented in under a hour with the thermal annealer, instead of the ten to thirty hours required for conventional furnace annealing.

The methods and systems described hereinabove can be used in the fabrication of a variety of superconducting devices. An illustrative example of such a device is a superconducting quantum interference device known by its acronym "SQUID".

A SQUID 200 typically consists of a wafer surrounded by and electrically connected to a superconductive spiral loop or coil patterned in a thin film. The wafer typically has two Josephson tunnel junctions connected in parallel by the superconductive loop. The superconductive loop typically has a multiplicity (e.g., 50) of turns of superconductor. In accordance with the invention the superconducting loop is made, for example, within a planar layer of TMO material. The layer has first regions which are superconducting and second regions, integral with the first regions, which are non-superconducting. The layer is patterned into this conduction geometry preferably by TMO material transformation pursuant to the invention.

Figure 16:
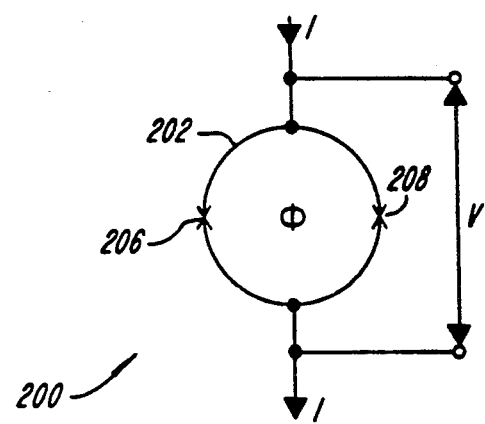
FIG. 16 is a graph of the operation of a SQUID.

In FIG. 16, the operation of a SQUID is shown. A small current flows through the Josephson tunnel junctions 206,208 as a supercurrent, without developing a voltage until the current exceeds a critical value, $i_c$. The value of $i_c$ and the current-voltage characteristics of the SQUID are oscillatory functions of the magnetic flux threading the loop 202. A current applied to the loop induces the magnetic flux. The SQUID can be used as a null detector, a current or flux detector, an amplifier, a logic device, memory, etc. Applications for such devices include magnetometers and high speed computer logic and memory elements.

To obtain a logic element, the SQUID is appropriately current biased such that the application of a flux pulse switches it from a zero voltage to a non-zero voltage state. Similarly, the SQUID can be used as a dissipation free memory cell for storing a logic one or logic zero as a clockwise or anti-clockwise circulating supercurrent.

While the SQUID is an example of a small-scale device improved by the practice of the invention, a wide variety of other superconducting electronic devices, such as filters and other signal processing elements, can also be constructed by the methods and systems disclosed herein.

The invention is particularly useful in electronic device manufacturing because the material transformation techniques can produce continuous and integral devices from TMO films. Because the transformation process leaves an essentially planar surface, the invention substantially reduces the problems of step coverage and optical depth of field in multi-layer structures.

The invention can also be used to commercial advantage because the transformation process is reversible, thereby permitting pattern repairs, the fine tuning of circuits and the customization of devices.

The invention can also be used to construct large-scale superconducting devices. The winding, or at least the outer material layer or skin of a winding, for example, in an MRI magnet or a superconducting power generator can be fabricated or patterned in accordance with the invention. The invention can also be used to form substantially insulative outer skins on superconducting shells or windings of such large scale devices.

The invention can be embodied in other specific forms without departing from the spirit or essential characteristics thereof. The described embodiments of the invention are to be considered in all respects as illustrative and not restrictive, the scope of the invention being indicated by the appended claims rather than the foregoing description, and all changes which come within the meaning and range of equivalency of the claims are therefore intended to be embraced therein.

Having described this invention, what is claimed as new and secured by Letters Patent is:

1. A method of forming a superconductive pattern in a selected ternary metal oxide material, the method comprising:

forming a film of superconductive material upon a substrate; and selectively irradiating regions of the film with photons in a predefined pattern to transform regions of the film from a superconducting state to a non-superconducting state by photothermally-induced material changes.

2. The method of claim 1 wherein the ternary metal oxide is a compound characterized by the formula $MBa_2Cu_3O_x$ where x falls in the range from approximately 6 to 9, and M is an element selected from the group consisting of Yttrium, Scandium, Lanthanum, Neodymium, Samarium, Europium, Gadolinium, Dysprosium, Holmium, Erbium, Ytterbium, and Lutetium.

3. The method of claim 1 wherein the step of irradiating regions of the film includes irradiating said regions with a laser in a direct write mode.

4. The method of claim 1 wherein the step of irradiating regions of the film includes irradiating said regions with a laser in a mask projection mode.

5. The method of claim 1 wherein the step of irradiating regions of the film includes irradiating said regions with a laser in a contact printing mode.

6. The method of claim 1 wherein the step of irradiating regions of the film includes irradiating said regions with a lamp in a contact printing mode.

7. The method of claim 1 wherein the irradiating step includes selectively exposing regions of the film to a light beam from a laser, and the exposing step includes forming a mask on said film for selectively defining said regions prior to said irradiating step.

8. The method of claim 1 wherein the irradiating step includes selectively exposing regions of the film to a light beam from a laser, and wherein the exposing step includes interposing a mask between the laser and the film, focusing the light beam on the film, and directing the light beam through the mask to the film.

9. The method of claim 1 further comprises maintaining the deposited film in an oxygen-right atmosphere during irradiation.

10. The method of claim 1 further comprises maintaining the deposited film in an oxygen-deficient atmosphere during irradiation.

11. A superconducting device having a pattern formed in accordance with the method of claim 1.

12. A method of producing a superconductive circuit comprising a superconduction phase showing superconductivity at a prescribed working temperature and a non-superconducting phase showing no superconductivity at a prescribed working temperature, said method comprising:
  a step of forming a film having said superconducting phase open a substrate; and
  a step of applying a laser beam to a part of superconducting phase on said film to cause transition of said part of said superconducting phase into said non-superconducting phase.

* * * * *